(12) United States Patent
Vranken et al.

(10) Patent No.: US 7,558,994 B2
(45) Date of Patent: Jul. 7, 2009

(54) METHODS AND APPARATUS FOR DATA COMPRESSION

(75) Inventors: Hendrikus Petrus Elisabeth Vranken, Eindhoven (NL); Hendrik Dirk Lodewijk Hollmann, Eindhoven (NL)

(73) Assignee: NXP B.V., Eindhoven (NL)

( * ) Notice: Subject to any disclaimer, the term of this patent is extended or adjusted under 35 U.S.C. 154(b) by 392 days.

(21) Appl. No.: 10/554,383

(22) PCT Filed: Apr. 27, 2004

(86) PCT No.: PCT/IB2004/050520

§ 371 (c)(1),
(2), (4) Date: Oct. 25, 2005

(87) PCT Pub. No.: WO2004/097438

PCT Pub. Date: Nov. 11, 2004

(65) Prior Publication Data

US 2007/0011514 A1    Jan. 11, 2007

(30) Foreign Application Priority Data

Apr. 29, 2003    (EP) .................................. 03101186

(51) Int. Cl.
*G01R 31/28* (2006.01)
(52) U.S. Cl. ........................ 714/724; 714/732; 714/738; 714/741
(58) Field of Classification Search ................. 714/724, 714/738, 758, E11.046, 733, 755, 739; 360/40; 375/240.16, E7.211, 240.22, E7.209
See application file for complete search history.

(56) References Cited

U.S. PATENT DOCUMENTS

| 2002/0099992 A1* | 7/2002 | Distler et al. ............... 714/738 |
| 2002/0162066 A1* | 10/2002 | Khoche et al. ............. 714/738 |
| 2007/0067688 A1* | 3/2007 | Vranken et al. ............. 714/733 |

OTHER PUBLICATIONS

Sying-Jyan Wang; Sheng-Nan Chiou, "Generating efficient tests for continuous scan,", 2001, Design Automation Conference, 2001. Proceedings, vol., No., pp. 162-165.*
Venkataraman, S.; Rajski, J.; Hellebrand, S.; Tarnick, S., "An Efficient Bist Scheme Based On Reseeding Of Multiple Polynomial Linear Feedback Shift Registers," Computer-Aided Design, 1993. ICCAD-93. Digest of Technical Papers., 1993 IEEE/ACM International Conference on , vol., No., pp. 572-577, Nov. 7-11, 1993.*
A. Jas and N.A. Touba, "Test Vector Compression via Cyclical Scan Chains and its Application to Testing Core- Based Designs", Proc. International Test Conference, pp. 458-464, 1998.*
C. Barnhart et al., OPMISR: The Foundation for Compressed ATPG Vectors, IEEE Proc. Int. Test Conf., 2001, pp. 748-757.*

* cited by examiner

*Primary Examiner*—John P Trimmings
*Assistant Examiner*—Daniel F McMahon

(57) ABSTRACT

A method and apparatus for compressing test vector data for use in testing a logic product, wherein original test vector data is generated in the form of two or more sequences of bits including "care" bits and "don't care" bits. The test vector data is then compressed by comparing corresponding bits of two or more subsequent vectors and merging the two or more vectors into a single vector representative thereof if all of the corresponding bits of the two or more vectors are found to be compatible. Compatibility of two bits is achieved if they do not have specifically incompatible or opposite values.

15 Claims, 6 Drawing Sheets

METHODS AND APPARATUS FOR DATA COMPRESSION

This invention relates to a method and apparatus for use in data compression and, more particularly but not necessarily exclusively, to a method and apparatus for reducing the volume of, or compressing, test data for use in testing logic products such as integrated circuit chips and the like, so as to economize on the amount of computer memory, disk storage and time required to test such products.

Each manufactured integrated circuit (IC) has to be tested thoroughly for manufacturing defects before it can be shipped to a customer. Conventional methods for testing IC's consist of automated generation of test patterns using an ATPG (Automated Test Pattern Generation) tool, and application of these test patterns to the IC using ATE (Automated Testing Equipment) and on-chip design-for-testability (DfT) structures.

A common DfT technique for digital logic circuits is 'scan design', which allows the flip-flops in the circuit to be configured into serial shift registers ('scan chains') during test mode. Referring to FIG. 6 of the drawings during scan testing, a test stimulus is shifted via one or more pins 204 first into the scan chains 200. After the complete test stimulus has been shifted in, the circuit 208 operates for one or more clock cycles in functional (or 'normal') mode. During a normal mode cycle, the stimulus in the flip-flops is applied to the logic cells 202 in the circuit, and the responses are captured in the flip-flops. After the normal mode cycles, the circuit is configured again into test mode, and the captured responses in the flip-flops are shifted out. This process is repeated until all test stimuli have been applied. Typically, shifting in a new test stimulus into the scan chains and shifting out the test responses of the previous test stimulus can be done substantially simultaneously.

An ATPG tool generates test patterns for a digital logic circuit, considering a particular fault model. This fault model is used to model the physical defects that can occur in a circuit, like short circuits, (resistive) open circuits, or bridges between wires. Each pattern as generated by the ATPG tool can be used to detect some of the modeled faults. The fault coverage (FC) of an ATPG test pattern set is defined as the ratio of the number of modeled faults that are detected by the test patterns, and the total number of modeled faults. Each test pattern consists of a test stimulus and the corresponding test responses.

A test pattern set as generated by an ATPG tool consists of p test patterns. Combinatorial ATPG is typically used for combinatorial circuits or full-scan sequential circuits, while sequential ATPG is typically used for partial-scan or non-scan sequential circuits. For pattern sets generated by combinatorial ATPG, the order of the patterns in the set is often arbitrary. For sequential ATPG, the patterns in a set are typically grouped, and the order of the patterns within each group is fixed.

Conceptually, each test pattern is made up of test vectors. A test vector is typically a sequence of '0' and '1' values, and contains stimulus bits for the IC input pins, and response bits for the IC output pins. If an IC has n pins, then the test vector for this IC will contain n bits, one bit for each pin. A test pattern typically consists of a sequence of v subsequent test vectors that are applied to the IC in a particular order.

The test vectors are stored in the ATE vector memory. The ATE reads the stimulus data in a particular test vector from the vector memory, and applies it to the IC pins. The responses on the IC output pins are captured by the ATE, and compared with the fault-free responses as stored in the ATE vector memory. The ATE is able to indicate for each test vector whether it passes or fails, and in the case of a fail, the ATE can report all IC pins that output a faulty response.

The current trend is to integrate more and more transistors on a single IC. According to Moore's law, this growth is exponential and the amount of transistors per IC roughly doubles every 1.5 years. As the size of a typical IC increases, it follows that the test data volume required to test such IC's must also increase. Furthermore, deep sub-micron IC process technologies introduce new defect types, which did not occur in previous process technologies. These new defects typically have an impact on the timing behavior of a circuit, and additional test patterns are required to detect these defects. As a consequence, the test data volume is increasing super-linear with the increasing IC sizes. In fact, test data volumes are expected to grow to the extent that they will no longer fit into a conventional ATE vector memory.

There are a number of possible solutions to this problem:

1. Limiting the test data volume to the capacity of the ATE vector memory. However, this implies that not all test patterns will be used to test an IC, such that the test quality is reduced, which is obviously undesirable.

2. Dividing the test data volume into multiple test sets, such that each individual test set fits into the ATE vector memory. However, the 'reloading' of the ATE vector memory to accommodate each test set increases the overall test time for an IC, which is also undesirable.

3. Extending the ATE vector memory. However, vector memory is expensive and, in any case, the ATE architecture imposes an upper limit for memory extension.

4. Replacing the conventional ATE with a newer ATE, which offers more vector memory. However, this is very expensive.

Thus, none of the above four possible solutions is truly adequate for dealing with increasing test data volume. In an alternative solution, the test data may be stored in the ATE vector memory in a compressed format. The data is decompressed by circuitry that resides either on the ATE itself, on the chip, or in the communication path between the ATE and the IC (e.g. on the 'load board').

In recent years, a large amount of test data compression techniques has been proposed. Most test data compression techniques exploit the fact that a large amount of the test data is in fact random data. In each test pattern, only a limited amount of stimulus bits is specified (usually only a few percent), i.e. 'care' bits, while most stimulus bits are 'don't care' and can be filled at random. In principle, only the specified stimulus bits have to be stored in the ATE, and this offers the possibility to compress the test data volume that has to be stored.

While generating test patterns, the ATPG tool inserts random values for the don't care stimulus bits. This process is referred to as 'random padding'. Published US Patent Application Numbers US 2002/0099991 A1 and US 2002/0099992 A1 describe arrangements in which test vectors are generated which contain both care bits and don't care bits. The don't care bits are filled with a repeated value, and the resulting test vectors are compressed using vector repeat. The filling strategies (or 'padding' types) proposed in the above-mentioned prior art documents are:

a) filling the don't cares using 'repeat fill'; or
  b) filling the don't cares using repetitive background data.

Using repetitive background data corresponds to 0-fill or 1-fill, where all of the don't care bits are filled with '0' or '1'. Repeat fill implies that each don't care bit in a sequence is given the same value as the most recent care bit.

For example, consider the sequence 0XX1XX, where the symbol X denotes a don't care bit. Applying a 0-fill to this sequence results in 000100 (i.e. all X's replaced with 0's). Applying a 1-fill to the same sequence results in 011111. Applying repeat fill results in 000111 (i.e. the X's after the 0 and before the 1 are assigned the value 0, whereas the X's after the 1 are assigned the value 1).

Test vectors can be compressed by using the vector repeat capability as supported by most ATE configurations. FIG. 1A is a schematic block diagram illustrating a typical ATE architecture. The test vectors are stored in the ATE vector memory 100, while the instruction memory 102 contains instructions as to how to apply these vectors to the IC 104. The instruction memory 102 may, for example, contain instructions to apply a particular vector for a number of cycles, which is called 'vector repeat'. This allows test data compression, since a sequence of v identical test vectors can be stored on the ATE using a single vector in the ATE vector memory 100 and an instruction in the ATE instruction memory 102 to repeat this vector v times.

An alternative ATE architecture is illustrated in FIG. 1B, where the vector memory 100 and instruction memory 102 are distributed. Each vector memory 100a, 100b, and its corresponding instruction memory 102a, 102b, is now used to apply data on a sub-set of the IC pins. Such a sub-set of IC pins is referred to herein as a pin-group or port FIG. 1B only shows two ports, but this can be extended to more than two ports, if desired. The number of pins per port may vary per port. In some cases, each port may correspond to a single IC pin, whereas in other cases, n-pin ports may be used, where n is an integer >1.

Since each port has its own vector memory and instruction memory, it is possible to repeat vector data per port.

We have now devised an improved arrangement.

In accordance with the present invention, there is provided a method of compressing data comprising at least two subsequent vectors, wherein a vector comprises one or more bits, the method being characterized by the steps of:

i) comparing corresponding bits in two subsequent vectors to determine if they are compatible; and, if said bits are compatible, ii) merging said vectors to create a single vector representative thereof;

wherein compatibility of two bits is achieved provided that they do not have specifically incompatible or opposite values.

Two bits are said to be incompatible if they are guaranteed to be distinct, i.e., two bits $b_1$ and $b_2$ are incompatible if $b_1 \neq b_2$, and $b_1 \neq X$, and $b_2 \neq X$.

In a preferred embodiment, the method includes the step of generating a repeat value in respect of one or more vectors, said repeat value being indicative of a number of times the respective merged vector should be repeated to reconstruct the original vector sequences of which the merged vector is representative.

Preferably, the data comprises test vector data for use in testing a logic product, and the method includes the steps of generating original test vector data comprising "care" and "don't care" bits, and compressing said test vector data according to steps i) and ii) defined above.

The original test vector data may be generated by means of an Automated Test Pattern Generation (ATPG) tool.

The present invention further extends to a data set comprising test vector data for use in testing a logic product, the test vector data being compressed by the above-defined method.

Also in accordance with the present invention, there is provided a method of testing a logic product, the method comprising the steps of generating compressed test vector data as defined above, reconstructing the care bits in the test vector data by repeating the merged vector one or more times according to its respective repeat value, applying the reconstructed test vector data to an input of the logic product, and obtaining the resultant output data. It will be appreciated that, in the original test vectors, there are care and don't care bits. After compression, information is lost with regard to the don't care bits. Thus, the term "reconstructing" used herein means reconstructing the care bits in the vectors i.e. without don't care bits. The original test vectors (with the don't care bits) cannot be reconstructed in this manner.

The method defined above may further include the step of compressing the output data in accordance with the method of compressing data as defined above.

Still further in accordance with the present invention, there is provided apparatus for compressing data comprising a sequence of at least two subsequent vectors, wherein a vector comprises one or more bits, the apparatus being characterized by:

i) means for comparing corresponding bits in two or more subsequent vectors to determine if they are compatible; and ii) means for merging said two or more vectors in which all corresponding bits of said vectors are compatible, to create a single vector representative of said two or more vectors;

wherein compatibility of two bits is achieved provided that they do not have specifically incompatible or opposite values.

It will be appreciated that a vector may comprise n bits, where n is a positive integer (i.e. 1 or more). In other words, a vector may comprise one or more bits.

Once again, the data may comprise test vector data for use in testing a logic product, and the apparatus includes means for generating or receiving original test vector data comprising two or more vectors including "care" bits and "don't care" bits.

Still further in accordance with the present invention, there is provided apparatus for testing a logic product, including means for generating original test vector data, apparatus for compressing the original test vector data as defined above, means for reconstructing the care bits in the test vector data, means for applying the reconstructed data to an input of the logic product, and means for obtaining the resultant output data.

The output data may also be compressed by means of the data compression apparatus defined above. The apparatus may further comprise means for reordering a test pattern, prior to compression thereof. Once again, the means for generating the original test vector data may comprise an Automated Test Pattern Generation (ATPG) tool.

The apparatus may comprise means for storing merged data sequences in the form of a data set for use in testing a logic product, and the present invention extends to electronic data storage means on which is stored a data set created by means of such apparatus.

Thus, in summary, test vectors typically contain a large amount of "don't care" bits (often >90%), and these don't care bits can be modified without affecting the fault coverage of these vectors. These don't care bits can be exploited, in accordance with the present invention, for compressing the test vectors, and hence for reducing the test data volume. Run-length encoding is employed to compress a sequence of test vectors. Such compression can be made optimal if the average run-length is maximal, and this optimum is achieved by the present invention by applying "merge fill".

The basic idea of merge fill is to fill the don't care bits in such a way that sequences of compatible test vectors are created. Each sequence of compatible test vectors can be merged into a single test vector plus, preferable, a repeat count value. Storing the merged test vectors and repeat counts requires less ATE memory when compared to storing the original test vectors. The net result is that the use of merge fill permits optimal run-length encoding, and allows larger reduction of test data volume compared with prior art techniques.

Thus, the method of the present invention differs from conventional padding methods because the don't care bits are padded by not only considering the bits that are being applied on a single pin, but on all pins on a port (in the case where n-pin ports are employed). Prior art configurations only consider padding for the ATE configuration illustrated in FIG. 1A, where all IC pins are connected to a single IC memory, whereas the present invention can also be used in ATE configurations as shown in FIG. 1B. For both ATE configurations, merge fill allows much higher repeat counts than other padding types, thereby significantly reducing the test data volume required to be stored.

An additional degree of freedom can be achieved by reordering the test patterns (as described below) to further reduce the number of test vectors that have to be stored in the ATE vector memory.

In another embodiment of the present invention, the don't care bits may be randomly filled in the case of sequences of <n vectors, and merge fill according to the present invention may be used to fill the don't care bits in a sequence of >n compatible vectors.

In principle, the don't care bits in test vectors can be assigned arbitrary values. However, the filling of don't care bits impacts the test quality of the test vectors. Particularly, the actual defect coverage, i.e., the number of detected physical defects, as well as the diagnostic resolution, i.e., the ability to identify which faults are present in a failing circuit, are affected by the filling of don't care bits. Test vectors in which the don't care bits are filled randomly, tend to have higher test quality than test vectors in which the don't care bits are filled with more regular values, like in 0-fill, 1-fill, repeat-fill, or merge-fill. To improve test quality, the don't care bits in incompatible vectors are therefore filled best with random values. Furthermore, if a sequence of compatible vectors is short (i.e., smaller than some value n), then the don't care bits in these vectors can also be filled with random values. If a sequence of compatible test vectors is large (i.e., larger than or equal to n), then merge-fill can be applied to fill the don't care bits in these vectors. The result is that higher test quality is achieved when compared to using merge-fill only, which comes at the cost of slightly reduced test data compression when using run-length encoding, i.e., vector repeat.

These and other aspects of the invention will be apparent from and elucidated with reference to the embodiments described hereinafter.

Embodiments of the present invention will now be described by way of examples only and with reference to the accompanying drawings, in which.

Figure 1A:
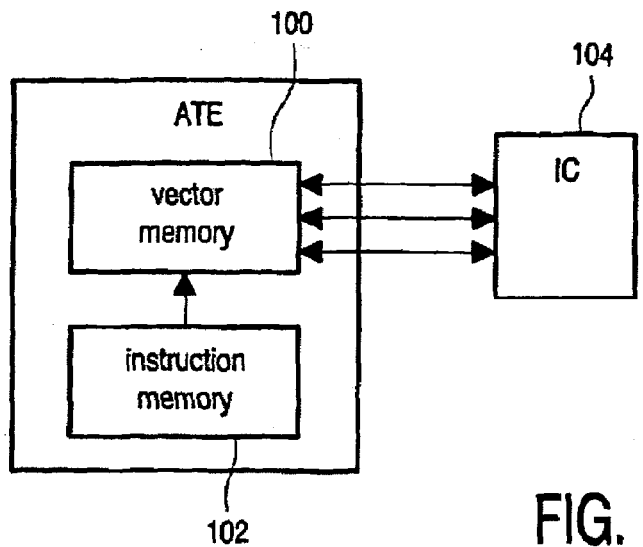
FIG. 1A is a schematic block diagram illustrating an ATE architecture according to one exemplary embodiment of the present invention.
Figure 1B:
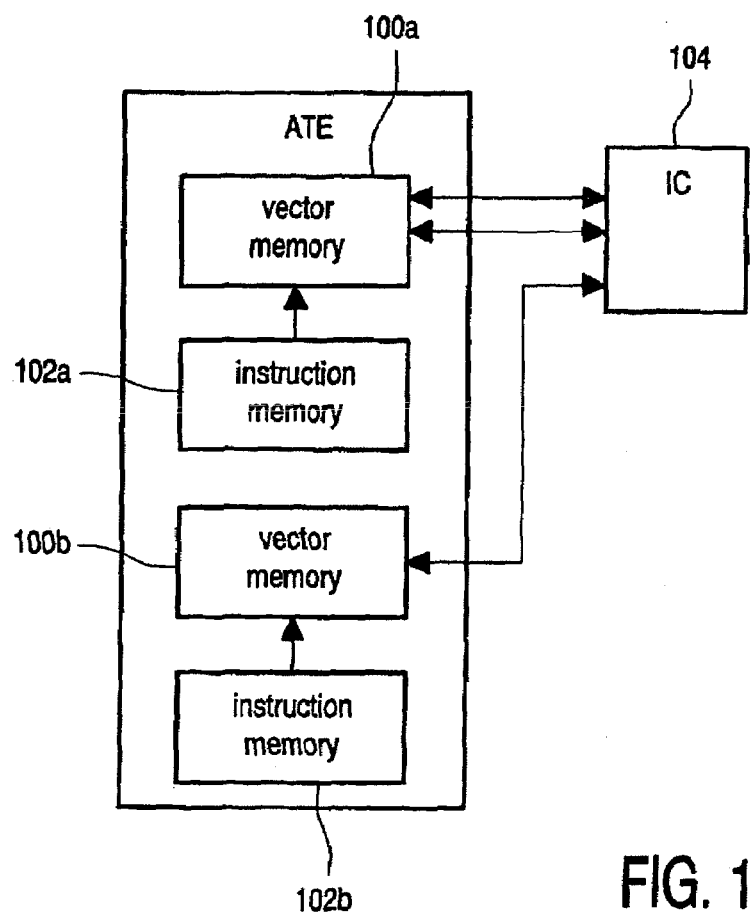
FIG. 1B is a schematic block diagram illustrating an ATE architecture according to another exemplary embodiment of the present invention.

The 'merging' concept will first be described. Consider a 3-valued logic

L={0, 1, X}. Using this notation, it implies that each bit in a sequence can have a value '0', '1' or 'X' (don't care). It will be appreciated that, as in the prior art, a don't care bit can be arbitrarily set to '0' or '1'.

For the purposes of the following, a sequence of two bits $b_1 b_2$ is said to be compatible if the sequence is 00, 0X, X0, 11, 1X, X1 or XX. The sequence is said to be incompatible if it is either 10 or 01. This can be extended to a sequence of n>2 bits, in which case the sequence is said to be compatible if all of the bits in the sequence are all 0 or X, all 1 or X, or all X. The sequence is said to be incompatible if it contains at least one bit that is 0 and at least one bit that is 1.

In accordance with this exemplary embodiment of the present invention, two compatible bits can be merged into a single bit using the 'merge' operator:

1. merge (00)=merge (0X)=merge (X0)=0

2. merge (11)=merge (1X)=merge (X1)=1

3. merge (XX)=X 4. merge (01) and merge (10) are undefined (because the sequences are incompatible)

This can be generalized for a sequence of n>2 bits:

1. merge $(\{0,X\}^-)=0$, where $\{0,X\}^-$ indicates a sequence of 0's and X's with at least one 0.

2. merge $(\{1,X\}^-)=1$, where $\{1,X\}^-$ indicates a sequence of 1's and X's with at least one 1.

3. merge $(\{X\}^+)=X$, where $X^+$ indicates a sequence of one or more X's.

4. merge $(\{0,1,X\}^-)$ is undefined where $\{0,1X\}^-$ indicates a sequence of 0's 1's and X's, with at least one 0, at least one 1, and zero or more X's.

A vector $v_i$ can be defined as a sequence of n bits ($v_{i1}, \ldots, v_{in}$). Two n-bit vectors $v_1, v_2$ are said to be compatible if, for all j ($1 \leq j \leq n$) holds that the bits $v_{1j}$ and $v_{2j}$ are compatible. Two compatible vectors $v_1$ and $v_2$ can be merged into a new vector $v^{merged}$, where $v^{merged}=(merge(v_{11},v_{21}), \ldots, merge(v_{1n},v_{2n}))$.

A test pattern consists of a sequence of v subsequent test vectors where v typically equals the number of scan shift cycles plus normal mode cycles. The v vectors in a test pattern have a fixed order.

A test pattern set consists of p test patterns, and the set is either ordered or unordered. If the test pattern set is ordered, the order of the p test patterns is fixed; the test pattern set then consists of a sequence of p·v test vectors in a fixed order. If the test pattern set is unordered, then it consists of a sequence of p·v test vectors, where the v vectors in each sub-sequence have a fixed order, but the order of the sub-sequences is not fixed.

A sequence of test vectors can be compressed by merging subsequent compatible vectors and the result is a sequence of k merged test vectors. The algorithm to do so is shown below. It can be proved mathematically that this compression algorithm is optimal, that is, results in a shortest possible sequence after merging.

```
k = 1;                                      /* k counts the number of merge-vectors    */
v_k^{merged} = v_i;                         /* merge-vector v_l^{merged} is vector v_l  */
For (2 < i < p · v) {                       /* iterate for all p · v vectors            */
If compatible (v_i, v_k^{merged})           /* if vector v_i and v_k^{merged} are compatible */
v_k^{merged} = merge (v_i, v_k^{merged})    /* then merge these vectors.                */
Else {                                      /* if vector v_i and v_k^{merged} are incompatible */
k++
v_k^{merged} = v_i;                         /* then create new merge-vector             */
  }
}
```

EXAMPLE 1

| | | | | | |
|---|---|---|---|---|---|
| $v_1$ = 0XX1X | $v_1^{merged}$ = 0XX1X | $v_1^{merged}$ = 0X010 | 3 | 0X010 | 00010 |
| $v_2$ = XX01X | $v_1^{merged}$ = 0X01X | $v_2^{merged}$ = 1XXXX | 1 | 0X010 | 00010 |
| $v_3$ = 0XXX0 | $v_1^{merged}$ = 0X010 | $v_1^{merged}$ = 0X110 | 2 | 0X010 | 00010 |
| $v_4$ = 1XXXX | $v_2^{merged}$ = 1XXXX | | | 1XXXX | 10101 |
| $v_5$ = 0XXX0 | $v_3^{merged}$ = 0XXX0 | | | 0X110 | 01110 |
| $v_6$ = XX11X | $v_3^{merged}$ = 0X110 | | | 0X110 | 01110 |
| (a) | (b) | (c) | (d) | (e) | (f) |

Referring to the above example, (a) denotes a sequence of 6 test vectors, and (b) shows the merged test vectors that are generated when executing the above algorithm. The resulting sequence consists of 3 merged test vectors as shown in (c). The specified bits in the original sequence of test vectors of (a) can be reconstructed from the sequence of merged test vectors of (c) by repeating each merged vector a number of times as indicated by (d). The reconstructed vector sequence is shown in (e), where the differences with (a) are underlined. It can be seen that both sequences have the same specified bits, but some don't care bits have been filled in (e). The remaining don't care bits in the merged test vectors can be filled randomly, as for example, illustrated in (f).

In the above example, storing the original test vector sequence requires storing 6 test vectors. Storing the merged test vector sequence requires storing only 3 merged test vectors, plus the repeat count for each merged test vector. The net effect is a significant reduction of the test data volume for storing this vector sequence.

For unordered pattern sets, the possibility to reorder the test patterns offers an additional degree of freedom. It is preferred to order the patterns in such a way that the last merged test vector of a pattern is compatible with the first merged test vector of the subsequent pattern. If this is the case, then these two merged test vectors can be merged into a single merged test vector.

Example 2 (below) refers to two test patterns (column (a)). The last vector of pattern 1 ($v_3^{merged}$) is incompatible with the first vector of pattern 2 ($v_4^{merged}$), and hence ordering pattern 2 after pattern 1 is not preferred. The last vector of pattern 2 ($v_6^{merged}$) is compatible with the first vector of pattern 1 ($v_1^{merged}$), and hence it is preferred to order pattern 2 before pattern 1. The resulting sequence of merged vectors with their repeat counts after test pattern reordering is illustrated by column (b).

EXAMPLE 2

| | | | | | |
|---|---|---|---|---|---|
| Pattern 1: | $v_1^{merged}$ = 0X010 | 3 | $v_4^{merged}$ = 0X010 | 2 |
| | $v_2^{merged}$ = 1XXXX | 2 | $v_5^{merged}$ = X1XX1 | 2 |
| | $v_3^{merged}$ = 0X110 | 1 | $v_6^{merged}$ = 0XX10 | 5 |
| Pattern 2: | $v_4^{merged}$ = 0X010 | 2 | $v_2^{merged}$ = 1XXXX | 2 |
| | $v_5^{merged}$ = X1XX1 | 2 | $v_3^{merged}$ = 0X110 | 1 |
| | $v_6^{merged}$ = 0XX10 | 2 | | |
| | (a) | | (b) | |

It can be seen, therefore, that the above procedure for pattern reordering is optimal, i.e. results in the shortest possible sequence of merged test vectors.

The merging of test vectors and reordering of test patterns can be integrated into the ATPG procedure. The don't care stimulus bits are now filled in such a way that compatible test vectors are created, which can be merged.

Figure 2A:
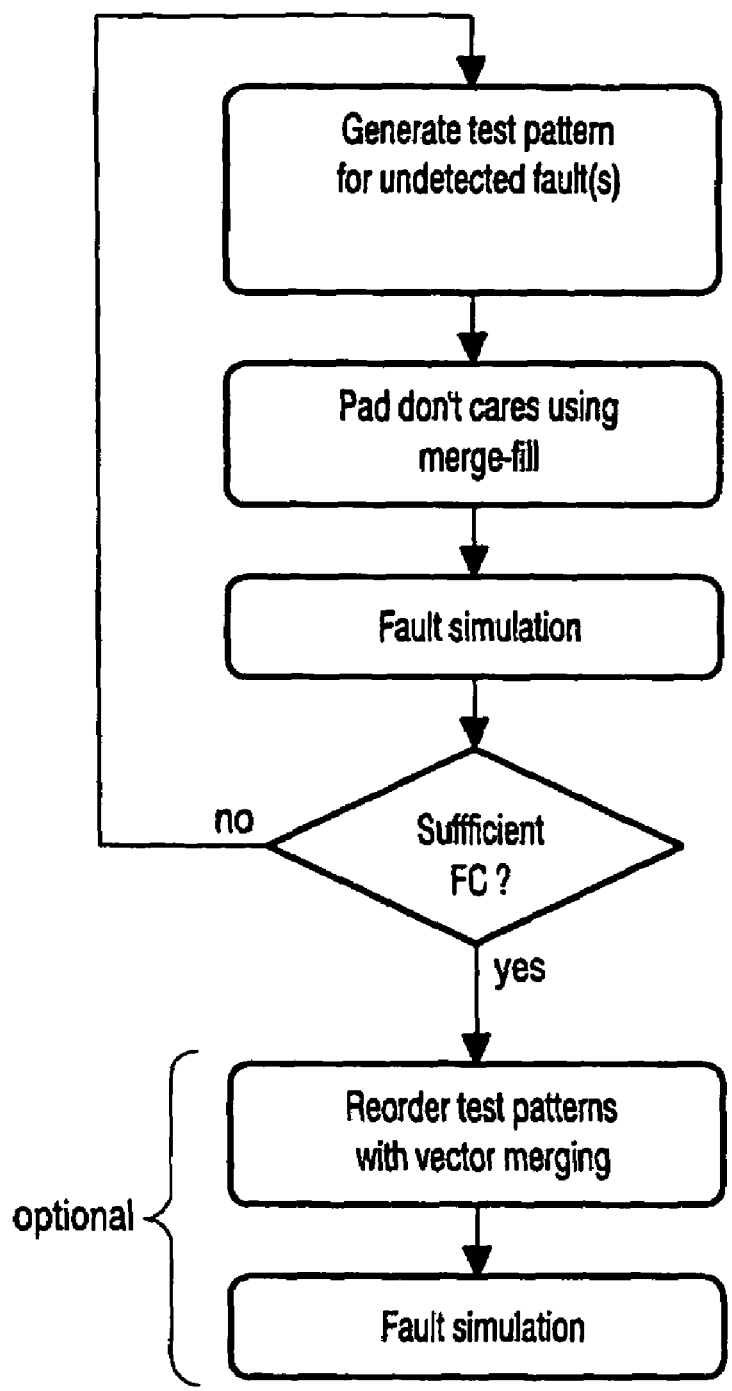
FIG. 2A is a flow diagram illustrating an ATPG procedure according to an exemplary embodiment of the present invention.
Figure 2B:
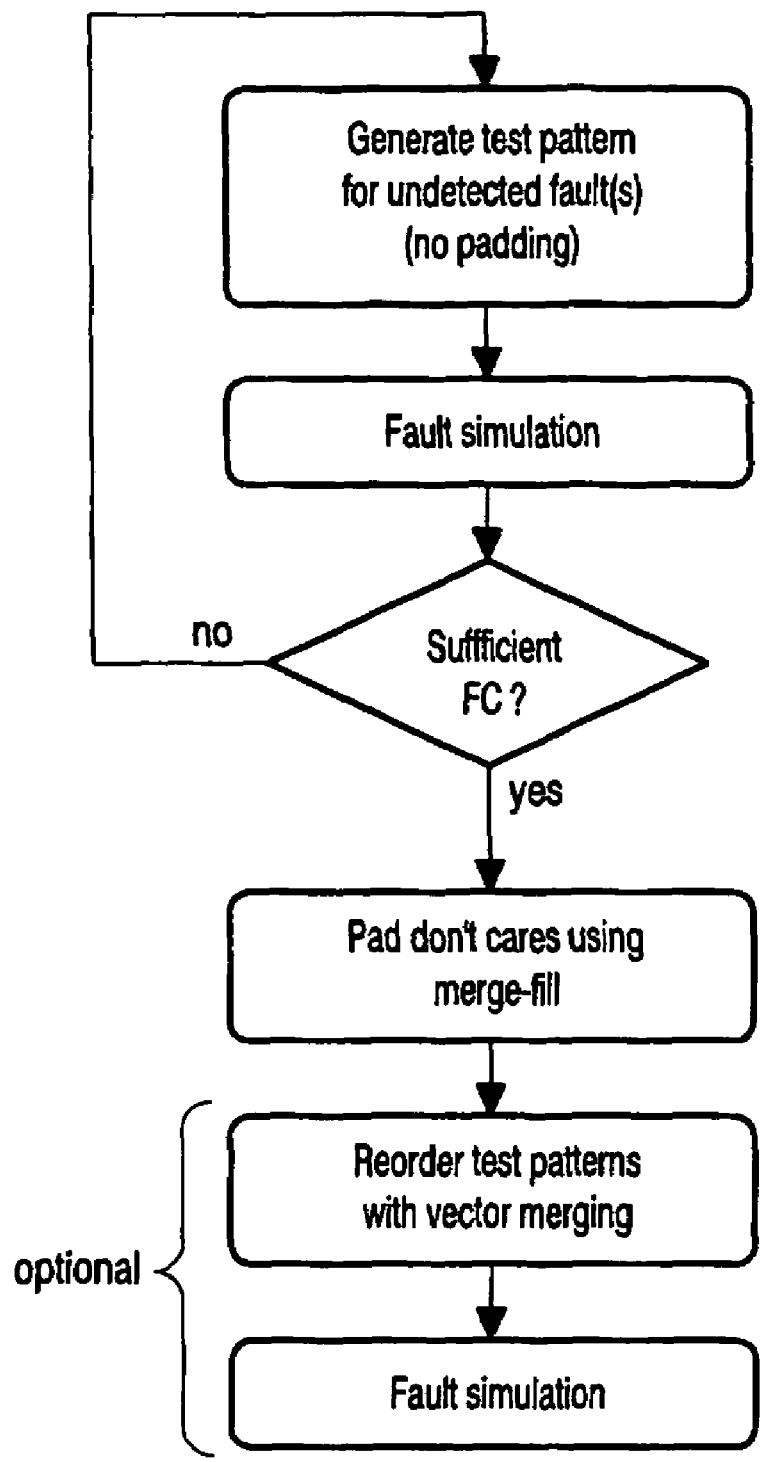
FIG. 2B is a flow diagram illustrating an ATPG procedure according to another exemplary embodiment of the present invention.

Two possible ATPG flows are shown in FIGS. 2A and 2B respectively. In FIG. 2A merge-fill is done for each individual test pattern, immediately after the pattern has been generated. The advantage of this approach is that the padded stimulus bits are considered during fault simulation, and hence the faults that are detected due to these stimulus bits are marked as detected faults. In FIG. 2B merge-fill is done after all patterns have been generated. Since fault simulation is performed on the patterns without padding, the number of test patterns may be slightly larger than for the flow in FIG. 2A. The advantage of the flow in FIG. 2B is somewhat more flexibility. In both flows, pattern reordering with vector merging, and a final fault simulation are optional.

Merging of vectors can be done for any sequence of vectors that have size n. In principle, for a circuit with t pins, all test vector have size t, and hence n=t. It is also possible to split each t-bit vector $v_i$ into a number of sub-vectors $v_{i1}, \ldots, v_{im}$. Each sub-vector $v_{ij}$ has size $s(v_{ij})$, with $1 < s(v_{ij}) < t$, and $\Sigma_{1 \leq j \leq m} s(v_{ij}) = t$. A sub-vector corresponds to the stimulus bits for a set of IC pins. Such a set of pins is usually referred to as a "pin-group" or "port".

Reduction of test data volume is achieved by the vector-repeat capability that is supported by current ATE. On some ATE vector-repeat is only possible for all pins: there is only a single port that contains all IC pins and hence there is only a single sequence of vectors. On other ATE, vector-repeat is possible per group of pins: there are multiple ports, where each port contains some subset of the IC pins, and there are as many sequences of sub-vectors as there are ports. In the extreme cases, each port contains a single pin, or a single port contains all pins. For other configurations, the number of pins per port varies between one and the number of IC pins.

In Example 3 (below), the first sequence of sub-vectors $v_{i1}$ is applied on port 1, and the second sequence of sub-vectors $v_{i2}$ on port 2. The above algorithm for merging test vectors is now executed twice: once on the first sequence of sub-vectors $v_{i1}$, and independently on the second sequence of sub-vectors $v_{i2}$. The results are shown in columns (b) and (c). The sequences of merged sub-vectors can be compressed as shown in columns (d) and (e). For each port, the merged sub-vectors are shown and the number of times that each sub-vector is repeated. The sequence on port 2 is represented by a single vector "10", which is repeated 6 times.

EXAMPLE 3 with merge fill is proven to be optimal, and is much larger than the average repeat count with repeat fill or other padding types.

Mathematical analysis indicates that the average repeat count for ports of n bits, is of the form $$E_n \approx c_n(q) \cdot \frac{1}{p},$$

where $p \cdot q$ is the probability that a stimulus bit is 0, $p \cdot (1-q)$ is the probability that a stimulus bit is 1, and $1-p$ is the probability that a stimulus bit is X. $c_n(q)$ is some constant that that depends on n and q.

For example, if n=1, then the average repeat count with merge fill is:

$$E_1 = c_1(q) \cdot \frac{1}{p} \text{ with } c_1(q) = \frac{1}{2q(1-q)}$$

And, if $n = 2$, then:

$$E_2 \approx c_2(q) \cdot \frac{1}{p} \text{ with } c_2(q) = 1 + \frac{1-q}{4q(1+q)} + \frac{q}{4(1-q)(2-q)}$$

For instance, for $q=\frac{1}{3}$ and $p=0.003$, it follows that $E_1=750$ and $E_2=483$. These results correspond to simulation results with random test vectors, which show 744 and 485 respectively.

Figure 3:
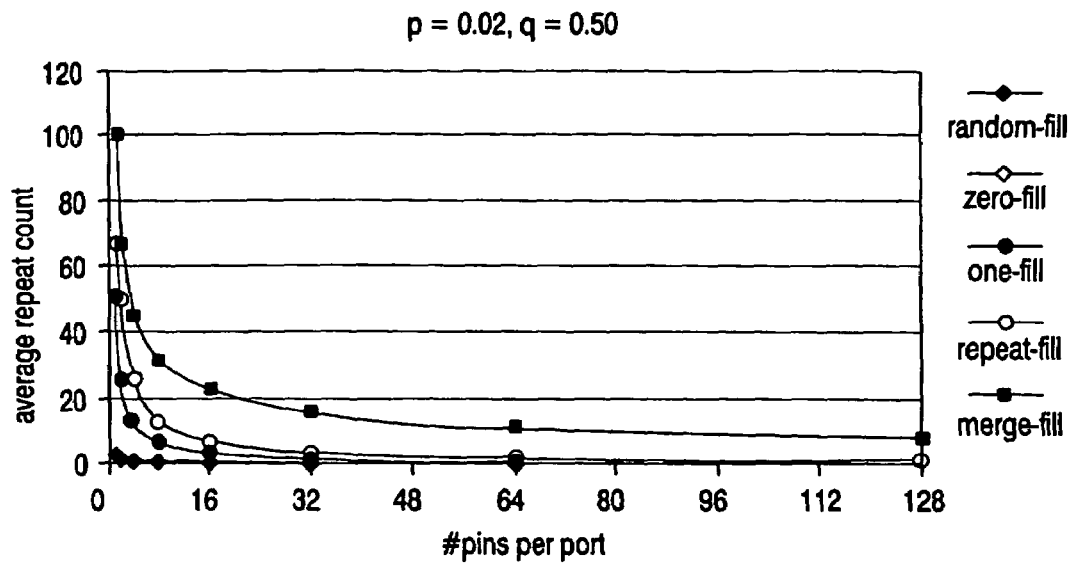
FIG. 3 is a graph illustrating the average repeat count for various padding types, while varying the number of pins per port (i.e. a comparison of merge fill with other padding types)

Results of simulation with random test vectors are shown in FIG. 3. The figure shows the average repeat count for various padding types, while varying the number of pins per port. The figure shows that for n=1 (repeat-per-pin), merge fill and repeat fill perform equally well. For n>1 (repeat-per-port), merge fill clearly outperforms repeat fill and other padding types.

Figure 4:
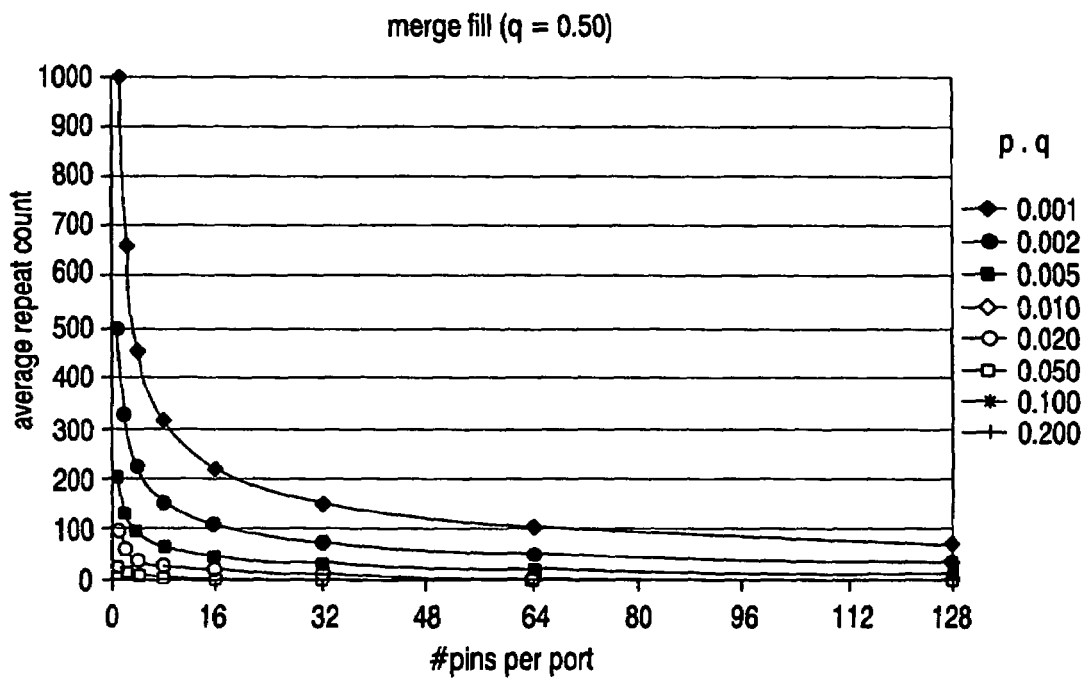
FIG. 4 is a graph illustrating the average repeat count within merge fill for varying probability p.

FIG. 4 shows the average repeat count with merge fill for various values of p. The figure shows that the average repeat

| Port 1, Port 2 | Port 1 | Port 2 | Port 1 | | Port 2 | |
|---|---|---|---|---|---|---|
| $v_1 = (0XX,1X)$ | $v_{11}^{merged} = 0XX$ | $v_{12}^{merged} = 1X$ | $v_{11}^{merged} = 0X0$ | 3 | $v_{12}^{merged} = 10$ | 6 |
| $v_2 = (XX0,1X)$ | $v_{11}^{merged} = 0X0$ | $v_{12}^{merged} = 1X$ | $v_{21}^{merged} = 1XX$ | 1 | | |
| $v_3 = (0XX,X0)$ | $v_{11}^{merged} = 0X0$ | $v_{12}^{merged} = 10$ | $v_{31}^{merged} = 0X1$ | 2 | | |
| $v_4 = (1XX,XX)$ | $v_{21}^{merged} = 1XX$ | $v_{12}^{merged} = 10$ | | | | |
| $v_5 = (0XX,X0)$ | $v_{31}^{merged} = 0XX$ | $v_{12}^{merged} = 10$ | | | | |
| $v_6 = (XX1,1X)$ | $v_{31}^{merged} = 0X$ | $v_{12}^{merged} = 10$ | | | | |
| (a) | (b) | (c) | (d) | | (e) | |

The basic idea proposed above is to use merge fill as ATPG padding strategy. It can be proved mathematically that the use of merge fill gives optimal results, that is, results in the longest possible sequences of compatible vectors and hence the longest repeat counts. Analysis, as well as simulation results, showing the following:

For repeat-per-pin (i.e. a port contains a single pin), merge fill is the same as repeat fill. Hence, in this case, both merge fill and repeat fill perform optimally, and the average repeat count with merge fill or repeat fill is proven to be higher than the average repeat count obtained with other padding strategies like random fill, zero fill, or one fill. For repeat-per-port (i.e. a port contains more than 1 pin), the average repeat count count decreases if p increases. This is as expected, since increasing p implies that the amount of don't care stimulus bits decreases, which leaves less room for optimizing repeat count by smartly filling of the don't cares. FIG. 3 and FIG. 4 both show that the average repeat count also decreases with increasing number of pins per port. This is also as expected, since having more pins per port lowers the probability of having compatible vectors.

Figure 5:
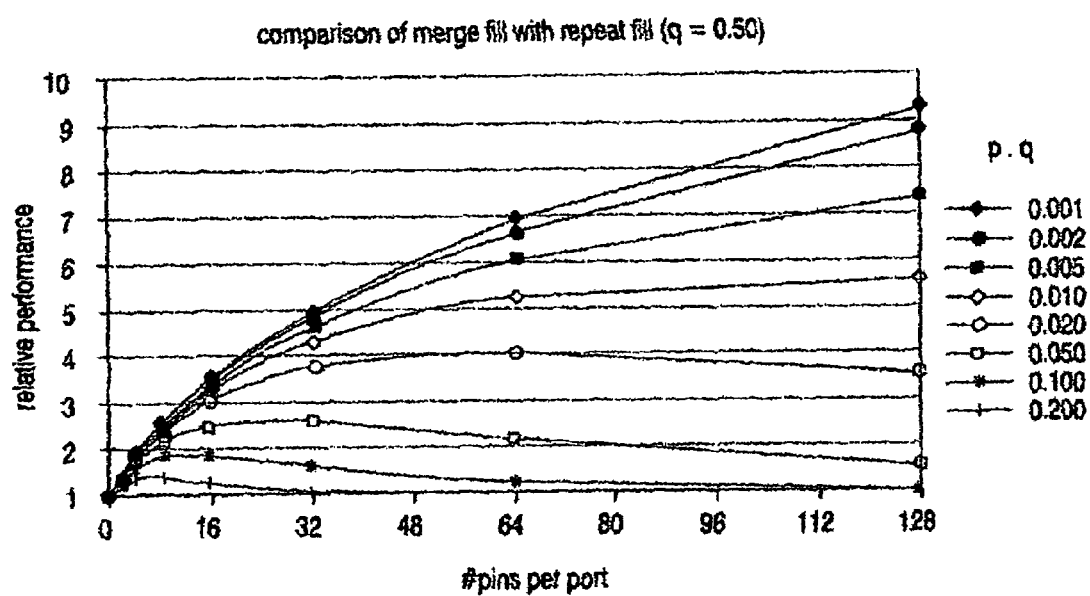
FIG. 5 is a graph illustrating the ratio of the average repeat counts obtained with merge fill and repeat fill, while varying the number of pins per port and probability p (i.e. comparison of merge fill, with repeat fill)
Figure 6:
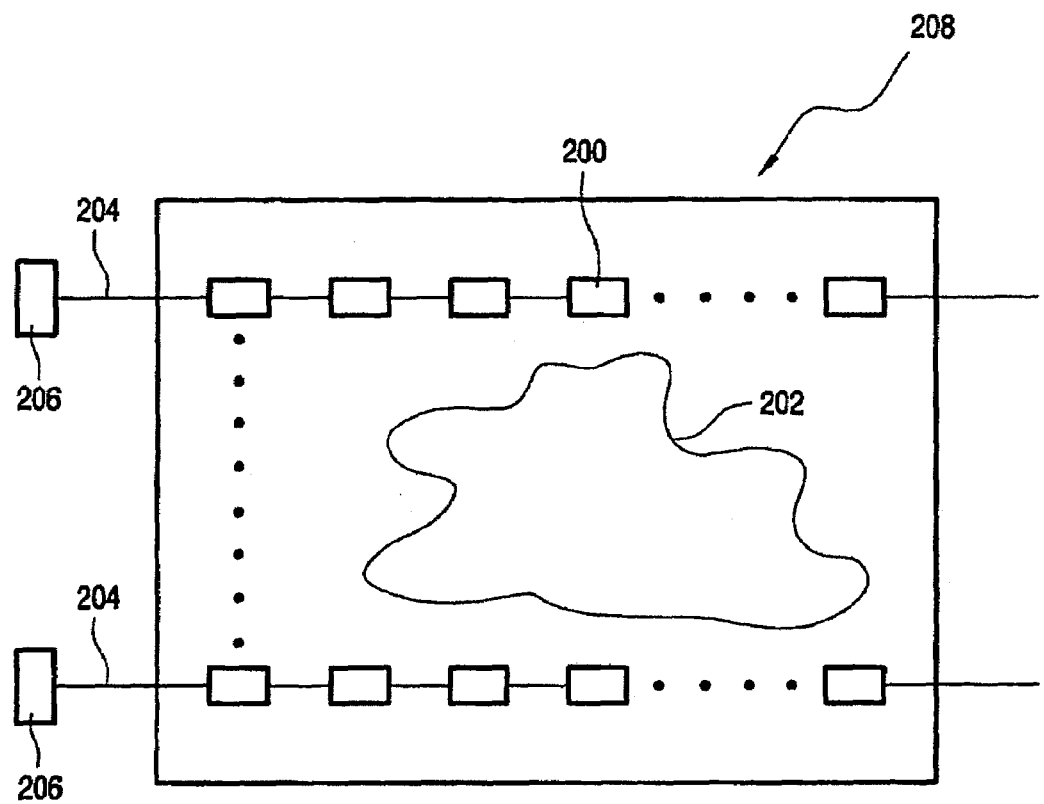
FIG. 6 is a schematic diagram illustrating an IC with flip-flops and combinational logic, where the flip-flops can be configured into scan chains.

FIG. 5 shows the ratio of the average repeat counts obtained with merge fill and repeat fill, while varying the number of pins per port and probability p. E.g. for $p \cdot q=0.01$, the average repeat count with merge fill is up to 6 times larger than with repeat fill.

EXAMPLE

The following example of vector repeat is taken from US patent application No. US2002/0099992. Consider the following 15 vectors of 9 bits wide. (Each column corresponds to a vector, and the vectors are ordered from right to left. The symbol "-" indicates that a bit is don't care.) Storing these 15 vectors requires 15×9=135 bits.

```
9 -----0---------
8 ------------1--
7 ---1-1---------1
6 -----1---------
5 ---------1-----
4 --------1----0--
3 ---0-----------
2 ------------1-0
1 -----0---0-----
```

The following vectors are obtained when applying repeat fill, and 0-fill for the initial don't care bits as proposed in US2002/0099992. (The vectors again are ordered from right to left).

```
9 000000000000000
8 111111111111100
7 111111111111111
6 111111000000000
5 111111111100000
4 111111110000000
3 000000000000000
2 111111111111100
1 000000000000000
```

It is now is required to store only 5 vectors (indicated in boldface), with repeat counts of 2 (vector 1-2), 3 (vector 3-5), 2 (vector 6-7), 2 (vector 8-9), and 6 (vector 10-15). This requires 5×9=45 bits of storage, plus 5 repeat count values, which results in (135-45)/135=67% reduction.

The following vectors are obtained when applying merge fill, as proposed in the present invention. (The vectors again are ordered from right to left).

```
9 000000000000000
8 111111111111111
7 111111111111111
6 111111111111111
5 111111111111111
4 111111110000000
3 000000000000000
2 111111111111100
1 000000000000000
```

It is now required to store only 3 vectors (indicated in boldface), with repeat counts of 2 (vector 1-2), 5(vector 3-7), and 8(vector 8-15). This requires 3×9=27 bits, plus 3 repeat count values, which results in (135-27)/135=80% reduction.

Thus, the present invention proposes merge fill in ATPG padding for reducing test data volume. Test vectors typically contain a large amount of don't care bits (often >90%), and these don't care bits can be modified without affecting the fault coverage of these vectors. The basic idea of merge fill is to fill the don't care bits in such a way that a sequence of compatible test vectors is created. Compatible vectors can be merged into a single test vector plus a repeat count value. Our compression corresponds to run-length encoding of a sequence of test vectors. It can be proven that the use of merge fill results in an optimal run-length code, in the sense that the longest possible run-lengths are achieved.

Storing merged test vectors and repeat counts, requires less ATE memory, when compared to storing the original test vectors. Merge fill is optimal, and outperforms all prior padding types.

In the specification, the notion of merge fill was extended for repeat-per-port, where each test vector is split into a number of sub-vectors, one sub-vector per port. For each port, merge fill can be applied independently. We also used an additional degree of freedom to reorder the test patterns, to further reduce the amount of merged test vectors.

The present invention offers an efficient and effective solution for handling the increasing test data volumes referenced to above. Application of the present invention avoids the threads on test quality, test time, and test costs.

Embodiments of the present invention have been described above by way of examples only, and it will be apparent to a person skilled in the art that modifications and variations can be made to the described embodiments without departing from the scope of the invention as defined by the appended claims. It will be further understood that the term "comprising" is not intended to exclude other elements or steps, the terms "a" or "an" are not intended to exclude a plurality, and a single processor, or other unit may fulfill the functions of several means recited in the claims.

The invention claimed is:

1. A method of compressing data that includes a sequence of subsequent vectors, the subsequent vectors each having one or more bits including care bits and don't care bits, the method comprising the steps of:
   comparing corresponding bits of the subsequent vectors to determine if they are compatible; and
   responsive to determining that, for a number of said vectors, all corresponding bits of the number of vectors are compatible,
      filling in the don't care bits of the number of vectors using a random fill process when the number of vectors is less than a number n,
      filling in the don't care bits of the number of vectors using a non-random fill process when the number of vectors is greater than or equal to the number n, and
      merging the number of vectors to create a single merged vector representative thereof.

2. A method according to claim 1, further comprising reconstructing the care bits of the number of vectors from the single merged vector, wherein said data comprises test vector data for use in testing a logic product, and the method includes generating or obtaining original test vector data.

3. A method according to claim 2, further comprising, responsive to determining that all corresponding bits of another number of the two or more subsequent vectors are not compatible, filling in the don't care bits of the other number of vectors using a random fill process, wherein said original test vector data is generated by means of an Automated Test Pattern Generation (ATPG) tool.

4. A method according to claim 2, further comprising the step of generating a repeat value indicative of a number of times a merged vector should be created.

5. A data set comprising test vector data for use in testing a logic product, said test vector data being compressed by the method of claim 4.

6. A method of testing a logic product, the method comprising the steps of generating compressed test vector data according to claim 5, reconstructing the test vector data one or more times according to the repeat value, and applying said reconstructed test vector data to an input of said logic product and obtaining the resultant output data.

7. A method according to claim 6, further comprising the step of compressing said output data comprising a sequence of at least two subsequent output vectors, wherein an output vector comprises one or more bits, the method being characterized by the steps of:

comparing corresponding bits of two or more subsequent output vectors to determine if they are compatible; and responsive to determining that all corresponding bits of said output vectors are compatible, merging said two or more output vectors to create a single output vector representative thereof.

8. Apparatus for compressing data that includes a sequence of at least two subsequent vectors, the at least two subsequent vectors each having one or more bits including care bits and don't care bits, the apparatus comprising circuitry configured to compare corresponding bits of the two or more subsequent vectors to determine if they are compatible; and responsive to determining that, for a number of said two or more vectors, all corresponding bits of the number of vectors are compatible, fill in the don't care bits of the number of vectors using a random fill process when the number of vectors is less than a number n, fill in the don't care bits of the number of vectors using a non-random fill process when the number of vectors is greater than or equal to the number n, and merge the number of vectors to create a single merged vector representative thereof.

9. Apparatus according to claim 8, wherein said data comprises test vector data for use in testing a logic product.

10. Apparatus according to claim 9, including an Automated Test Pattern Generation (ATPG) tool to generate original test vector data.

11. Apparatus according to claim 9, including a memory to store merged vectors for use in testing the logic product.

12. A method according to claim 1, wherein the non-random fill process proceeds by one or more of repeat fill or repetitive background data fill.

13. A method according to claim 1, wherein the comparing and merging steps are repeated, resulting in a plurality of merged vectors.

14. A method according to claim 13, wherein the merged vectors are arranged in a sequence of merged vector sets, each merged vector set having a first merged vector and a last merged vector, the method further comprising ordering the merged vector sets so that the last merged vector of one merged vector set is compatible with the first merged vector of a subsequent merged vector set.

15. A method according to claim 14, further comprising merging the last merged vector of the one merged vector set with the first merged vector of the subsequent merged vector set.

* * * * *